United States Patent
Gu et al.

(10) Patent No.: US 9,185,429 B1
(45) Date of Patent: Nov. 10, 2015

(54) VIDEO ENCODING AND DECODING USING UN-EQUAL ERROR PROTECTION

(75) Inventors: Qunshan Gu, Hayward, CA (US); Ronghua Wu, Albany, CA (US)

(73) Assignee: GOOGLE INC., Mountain View, CA (US)

( * ) Notice: Subject to any disclaimer, the term of this patent is extended or adjusted under 35 U.S.C. 154(b) by 864 days.

(21) Appl. No.: 13/460,047

(22) Filed: Apr. 30, 2012

(51) Int. Cl.
*H04N 7/12* (2006.01)
*H04N 19/67* (2014.01)
*H03M 13/35* (2006.01)

(52) U.S. Cl.
CPC ............ *H04N 19/67* (2014.11); *H03M 13/356* (2013.01)

(58) Field of Classification Search
CPC ....... H04N 19/67; H04N 19/65; H04N 19/36; H04N 19/60
See application file for complete search history.

(56) References Cited

U.S. PATENT DOCUMENTS

| | | | |
|---|---|---|---|
| 5,452,435 | A | 9/1995 | Malouf et al. |
| 5,638,114 | A | 6/1997 | Hatanaka et al. |
| 5,731,840 | A | 3/1998 | Kikuchi et al. |
| 5,801,756 | A | 9/1998 | Iizawa |
| 6,021,213 | A | 2/2000 | Helterbrand et al. |
| 6,025,870 | A | 2/2000 | Hardy |
| 6,091,777 | A | 7/2000 | Guetz et al. |
| 6,108,383 | A | 8/2000 | Miller et al. |
| 6,195,391 | B1 | 2/2001 | Hancock et al. |
| 6,204,847 | B1 | 3/2001 | Wright |
| 6,243,416 | B1 | 6/2001 | Matsushiro et al. |
| 6,243,683 | B1 | 6/2001 | Peters |
| 6,266,337 | B1 | 7/2001 | Marco |
| 6,346,963 | B1 | 2/2002 | Katsumi |
| 6,363,067 | B1 | 3/2002 | Chung |
| 6,421,387 | B1 | 7/2002 | Rhee |
| 6,462,791 | B1 | 10/2002 | Zhu |
| 6,473,460 | B1 | 10/2002 | Topper |
| 6,483,454 | B1 | 11/2002 | Torre et al. |
| 6,483,928 | B1 * | 11/2002 | Bagni et al. .................. 382/107 |

(Continued)

FOREIGN PATENT DOCUMENTS

| | | |
|---|---|---|
| EP | 1777969 | 4/2007 |
| JP | 0715711 | 1/1995 |

(Continued)

OTHER PUBLICATIONS

Friedman, et al., "RTP: Control Protocol Extended Reports (RTPC XR)," Network Working Group RFC 3611 (The Internet Society 2003) (52 pp).

(Continued)

*Primary Examiner* — Nhon Diep
(74) *Attorney, Agent, or Firm* — Young Basile Hanlon & MacFarlane P.C.

(57) ABSTRACT

Systems, apparatuses and methods for encoding and decoding a video stream having a plurality of frames are disclosed. When encoding, for example, blocks are selected in spiral fashion until contiguous blocks of at least a central section of the frame are selected. The selected blocks are encoded in an order in which they were selected. A first level of error protection is applied to encoded blocks within the central section. A second, different level of error protection is applied to encoded blocks outside the central section. By using a spiral scan and selective error protection, blocks most likely to have information of interest to a viewer are identified and can be encoded and error-protected to provide better image quality in the area of interest when decoded.

20 Claims, 9 Drawing Sheets

(56) References Cited

U.S. PATENT DOCUMENTS

| | | |
|---|---|---|
| 6,532,306 B1 | 3/2003 | Boon et al. |
| 6,556,588 B2 | 4/2003 | Wan et al. |
| 6,577,333 B2 | 6/2003 | Tai et al. |
| 6,587,985 B1 | 7/2003 | Fukushima et al. |
| 6,681,362 B1 | 1/2004 | Abbott et al. |
| 6,684,354 B2 | 1/2004 | Fukushima et al. |
| 6,687,304 B1 | 2/2004 | Peng |
| 6,707,852 B1 | 3/2004 | Wang |
| 6,711,209 B1 | 3/2004 | Lainema et al. |
| 6,728,317 B1 | 4/2004 | Demos |
| 6,732,313 B2 | 5/2004 | Fukushima et al. |
| 6,741,569 B1 | 5/2004 | Clark |
| 6,812,956 B2 | 11/2004 | Ferren et al. |
| 6,816,836 B2 | 11/2004 | Basu et al. |
| 6,918,077 B2 | 7/2005 | Fukushima et al. |
| 6,952,450 B2 | 10/2005 | Cohen |
| 7,007,098 B1 | 2/2006 | Smyth et al. |
| 7,007,235 B1 | 2/2006 | Hussein et al. |
| 7,015,954 B1 | 3/2006 | Foote et al. |
| 7,116,830 B2 | 10/2006 | Srinivasan |
| 7,124,333 B2 | 10/2006 | Fukushima et al. |
| 7,178,106 B2 | 2/2007 | Lamkin et al. |
| 7,180,896 B1 | 2/2007 | Okumura |
| 7,197,070 B1 | 3/2007 | Zhang et al. |
| 7,218,674 B2 | 5/2007 | Kuo |
| 7,219,062 B2 | 5/2007 | Colmenarez et al. |
| 7,236,527 B2 | 6/2007 | Ohira |
| 7,253,831 B2 | 8/2007 | Gu |
| 7,263,125 B2 | 8/2007 | Lainema |
| 7,263,644 B2 | 8/2007 | Park et al. |
| 7,356,750 B2 | 4/2008 | Fukushima et al. |
| 7,372,834 B2 | 5/2008 | Kim et al. |
| 7,376,880 B2 | 5/2008 | Ichiki et al. |
| 7,379,653 B2 | 5/2008 | Yap et al. |
| 7,424,056 B2 | 9/2008 | Lin et al. |
| 7,447,235 B2 | 11/2008 | Luby et al. |
| 7,447,969 B2 | 11/2008 | Park et al. |
| 7,450,642 B2 | 11/2008 | Youn |
| 7,457,362 B2 | 11/2008 | Sankaran |
| 7,471,724 B2 * | 12/2008 | Lee .................. 375/240.12 |
| 7,484,157 B2 | 1/2009 | Park et al. |
| 7,502,818 B2 | 3/2009 | Kohno et al. |
| 7,577,898 B2 | 8/2009 | Costa et al. |
| 7,636,298 B2 | 12/2009 | Miura et al. |
| 7,664,185 B2 | 2/2010 | Zhang et al. |
| 7,664,246 B2 | 2/2010 | Krantz et al. |
| 7,680,076 B2 | 3/2010 | Michel et al. |
| 7,684,982 B2 | 3/2010 | Taneda |
| 7,710,973 B2 | 5/2010 | Rumbaugh et al. |
| 7,735,111 B2 | 6/2010 | Michener et al. |
| 7,739,714 B2 | 6/2010 | Guedalia |
| 7,756,127 B2 | 7/2010 | Nagai et al. |
| 7,797,274 B2 | 9/2010 | Strathearn et al. |
| 7,822,607 B2 | 10/2010 | Aoki et al. |
| 7,823,039 B2 | 10/2010 | Park et al. |
| 7,860,718 B2 | 12/2010 | Lee et al. |
| 7,864,210 B2 | 1/2011 | Kennedy |
| 7,886,071 B2 | 2/2011 | Tomita |
| 7,974,243 B2 | 7/2011 | Nagata et al. |
| 8,000,546 B2 | 8/2011 | Yang et al. |
| 8,010,185 B2 | 8/2011 | Ueda |
| 8,019,175 B2 | 9/2011 | Lee et al. |
| 8,060,651 B2 | 11/2011 | Deshpande et al. |
| 8,085,767 B2 | 12/2011 | Lussier et al. |
| 8,087,056 B2 | 12/2011 | Ryu |
| 8,130,823 B2 | 3/2012 | Gordon et al. |
| 8,139,642 B2 | 3/2012 | Vilei et al. |
| 8,161,159 B1 | 4/2012 | Shetty et al. |
| 8,175,041 B2 | 5/2012 | Shao et al. |
| 8,176,524 B2 | 5/2012 | Singh et al. |
| 8,179,983 B2 | 5/2012 | Gordon et al. |
| 8,208,545 B2 | 6/2012 | Seo et al. |
| 8,233,539 B2 | 7/2012 | Kwon |
| 8,265,450 B2 | 9/2012 | Black et al. |
| 8,307,403 B2 | 11/2012 | Bradstreet et al. |
| 8,311,111 B2 | 11/2012 | Xu et al. |
| 8,325,796 B2 | 12/2012 | Wilkins et al. |
| 8,369,411 B2 | 2/2013 | Au et al. |
| 8,438,451 B2 | 5/2013 | Lee et al. |
| 8,443,398 B2 | 5/2013 | Swenson et al. |
| 8,448,259 B2 | 5/2013 | Haga et al. |
| 8,494,053 B2 | 7/2013 | He et al. |
| 8,526,498 B2 | 9/2013 | Lim et al. |
| 8,553,776 B2 | 10/2013 | Shi et al. |
| 8,566,886 B2 | 10/2013 | Scholl |
| 8,666,181 B2 | 3/2014 | Venkatapuram et al. |
| 8,666,186 B1 * | 3/2014 | Rasche .................. 382/244 |
| 8,711,935 B2 | 4/2014 | Kim et al. |
| 8,724,702 B1 | 5/2014 | Bulusu et al. |
| 8,761,242 B2 | 6/2014 | Jeon et al. |
| 8,856,624 B1 | 10/2014 | Paniconi |
| 2002/0035714 A1 | 3/2002 | Kikuchi et al. |
| 2002/0085637 A1 | 7/2002 | Henning |
| 2002/0140851 A1 | 10/2002 | Laksono |
| 2002/0152318 A1 | 10/2002 | Menon et al. |
| 2002/0157058 A1 | 10/2002 | Ariel et al. |
| 2002/0176604 A1 | 11/2002 | Shekhar et al. |
| 2002/0191072 A1 | 12/2002 | Henrikson |
| 2003/0012287 A1 | 1/2003 | Katsavounidis et al. |
| 2003/0016630 A1 | 1/2003 | Vega-Garcia et al. |
| 2003/0061368 A1 | 3/2003 | Chaddha |
| 2003/0098992 A1 | 5/2003 | Park et al. |
| 2003/0226094 A1 | 12/2003 | Fukushima et al. |
| 2003/0229822 A1 | 12/2003 | Kim et al. |
| 2003/0229900 A1 | 12/2003 | Reisman |
| 2004/0071170 A1 | 4/2004 | Fukuda |
| 2004/0105004 A1 | 6/2004 | Rui et al. |
| 2004/0165585 A1 | 8/2004 | Imura et al. |
| 2004/0172252 A1 | 9/2004 | Aoki et al. |
| 2004/0172255 A1 | 9/2004 | Aoki et al. |
| 2004/0184444 A1 | 9/2004 | Aimoto et al. |
| 2004/0196902 A1 | 10/2004 | Faroudja |
| 2004/0233938 A1 | 11/2004 | Yamauchi |
| 2005/0024487 A1 | 2/2005 | Chen |
| 2005/0041150 A1 | 2/2005 | Gewickey et al. |
| 2005/0076272 A1 | 4/2005 | Delmas et al. |
| 2005/0117653 A1 | 6/2005 | Sankaran |
| 2005/0125734 A1 | 6/2005 | Mohammed et al. |
| 2005/0154965 A1 | 7/2005 | Ichiki et al. |
| 2005/0157793 A1 | 7/2005 | Ha et al. |
| 2005/0180415 A1 | 8/2005 | Cheung et al. |
| 2005/0185715 A1 | 8/2005 | Karczewicz et al. |
| 2005/0220188 A1 | 10/2005 | Wang |
| 2005/0251856 A1 | 11/2005 | Araujo et al. |
| 2005/0259729 A1 | 11/2005 | Sun |
| 2005/0265447 A1 | 12/2005 | Park |
| 2006/0005106 A1 | 1/2006 | Lane et al. |
| 2006/0013310 A1 | 1/2006 | Lee et al. |
| 2006/0039470 A1 | 2/2006 | Kim et al. |
| 2006/0066717 A1 | 3/2006 | Miceli |
| 2006/0146940 A1 | 7/2006 | Gomila et al. |
| 2006/0150055 A1 | 7/2006 | Quinard et al. |
| 2006/0153217 A1 | 7/2006 | Chu et al. |
| 2006/0188024 A1 * | 8/2006 | Suzuki et al. ............ 375/240.23 |
| 2006/0215014 A1 | 9/2006 | Cohen et al. |
| 2006/0215752 A1 | 9/2006 | Lee et al. |
| 2006/0247927 A1 | 11/2006 | Robbins et al. |
| 2006/0248563 A1 | 11/2006 | Lee et al. |
| 2006/0282774 A1 | 12/2006 | Covell et al. |
| 2006/0291475 A1 | 12/2006 | Cohen |
| 2007/0036354 A1 | 2/2007 | Wee et al. |
| 2007/0064094 A1 | 3/2007 | Potekhin et al. |
| 2007/0080971 A1 | 4/2007 | Sung |
| 2007/0081522 A1 | 4/2007 | Apelbaum |
| 2007/0081587 A1 | 4/2007 | Raveendran et al. |
| 2007/0097257 A1 | 5/2007 | El-Maleh et al. |
| 2007/0121100 A1 | 5/2007 | Divo |
| 2007/0168824 A1 | 7/2007 | Fukushima et al. |
| 2007/0195893 A1 | 8/2007 | Kim et al. |
| 2007/0223529 A1 | 9/2007 | Lee et al. |
| 2007/0237226 A1 | 10/2007 | Regunathan et al. |
| 2007/0237232 A1 | 10/2007 | Chang et al. |
| 2007/0250754 A1 | 10/2007 | Costa et al. |
| 2007/0268964 A1 | 11/2007 | Zhao |

(56) References Cited

U.S. PATENT DOCUMENTS

| | | |
|---|---|---|
| 2007/0285505 A1 | 12/2007 | Korneliussen |
| 2007/0296822 A1 | 12/2007 | Lan et al. |
| 2008/0037624 A1 | 2/2008 | Walker et al. |
| 2008/0043832 A1 | 2/2008 | Barkley et al. |
| 2008/0072267 A1 | 3/2008 | Monta et al. |
| 2008/0089414 A1 | 4/2008 | Wang et al. |
| 2008/0101403 A1 | 5/2008 | Michel et al. |
| 2008/0109707 A1 | 5/2008 | Dell et al. |
| 2008/0126278 A1 | 5/2008 | Bronstein et al. |
| 2008/0134005 A1 | 6/2008 | Izzat et al. |
| 2008/0144553 A1 | 6/2008 | Shao et al. |
| 2008/0209300 A1 | 8/2008 | Fukushima et al. |
| 2008/0225944 A1 | 9/2008 | Pore et al. |
| 2008/0250294 A1 | 10/2008 | Ngo et al. |
| 2008/0260042 A1 | 10/2008 | Shah et al. |
| 2008/0270528 A1 | 10/2008 | Girardeau et al. |
| 2008/0273591 A1 | 11/2008 | Brooks et al. |
| 2008/0310745 A1 | 12/2008 | Ye et al. |
| 2009/0006927 A1 | 1/2009 | Sayadi et al. |
| 2009/0007159 A1 | 1/2009 | Rangarajan et al. |
| 2009/0010325 A1 | 1/2009 | Nie et al. |
| 2009/0013086 A1 | 1/2009 | Greenbaum |
| 2009/0022157 A1 | 1/2009 | Rumbaugh et al. |
| 2009/0031390 A1 | 1/2009 | Rajakarunanayake et al. |
| 2009/0059067 A1 | 3/2009 | Takanohashi et al. |
| 2009/0059917 A1 | 3/2009 | Lussier et al. |
| 2009/0080510 A1 | 3/2009 | Wiegand et al. |
| 2009/0103635 A1 | 4/2009 | Pahalawatta |
| 2009/0122867 A1 | 5/2009 | Mauchly et al. |
| 2009/0125812 A1 | 5/2009 | Blinnikka et al. |
| 2009/0138784 A1 | 5/2009 | Tamura et al. |
| 2009/0144417 A1 | 6/2009 | Kisel et al. |
| 2009/0161763 A1 | 6/2009 | Rossignol et al. |
| 2009/0180537 A1 | 7/2009 | Park et al. |
| 2009/0196342 A1 | 8/2009 | Divorra Escoda et al. |
| 2009/0238277 A1 | 9/2009 | Meehan |
| 2009/0241147 A1 | 9/2009 | Kim et al. |
| 2009/0245351 A1 | 10/2009 | Watanabe |
| 2009/0249158 A1 | 10/2009 | Noh et al. |
| 2009/0254657 A1 | 10/2009 | Melnyk et al. |
| 2009/0268819 A1 | 10/2009 | Nishida |
| 2009/0276686 A1 | 11/2009 | Liu et al. |
| 2009/0276817 A1 | 11/2009 | Colter et al. |
| 2009/0303176 A1 | 12/2009 | Chen et al. |
| 2009/0322854 A1 | 12/2009 | Ellner |
| 2010/0040349 A1 | 2/2010 | Landy |
| 2010/0054333 A1 | 3/2010 | Bing et al. |
| 2010/0077058 A1 | 3/2010 | Messer |
| 2010/0080297 A1* | 4/2010 | Wang et al. ............... 375/240.16 |
| 2010/0086028 A1 | 4/2010 | Tanizawa et al. |
| 2010/0118945 A1 | 5/2010 | Wada et al. |
| 2010/0122127 A1 | 5/2010 | Oliva et al. |
| 2010/0128796 A1 | 5/2010 | Choudhury |
| 2010/0149301 A1 | 6/2010 | Lee et al. |
| 2010/0153828 A1 | 6/2010 | De Lind Van Wijngaarden et al. |
| 2010/0171882 A1 | 7/2010 | Cho et al. |
| 2010/0192078 A1 | 7/2010 | Hwang et al. |
| 2010/0202414 A1 | 8/2010 | Malladi et al. |
| 2010/0220172 A1 | 9/2010 | Michaelis |
| 2010/0235820 A1 | 9/2010 | Khouzam et al. |
| 2010/0306618 A1 | 12/2010 | Kim et al. |
| 2010/0309372 A1 | 12/2010 | Zhong |
| 2010/0309982 A1 | 12/2010 | Le Floch et al. |
| 2011/0033125 A1 | 2/2011 | Shiraishi |
| 2011/0069890 A1 | 3/2011 | Besley |
| 2011/0093273 A1 | 4/2011 | Lee et al. |
| 2011/0103480 A1 | 5/2011 | Dane |
| 2011/0131144 A1 | 6/2011 | Ashour et al. |
| 2011/0158529 A1 | 6/2011 | Malik |
| 2011/0194605 A1 | 8/2011 | Amon et al. |
| 2011/0218439 A1 | 9/2011 | Masui et al. |
| 2011/0235706 A1 | 9/2011 | Demircin et al. |
| 2011/0293001 A1 | 12/2011 | Lim et al. |
| 2012/0013705 A1 | 1/2012 | Taylor et al. |
| 2012/0014436 A1 | 1/2012 | Segall et al. |
| 2012/0014437 A1 | 1/2012 | Segall et al. |
| 2012/0014438 A1 | 1/2012 | Segall et al. |
| 2012/0014439 A1 | 1/2012 | Segall et al. |
| 2012/0014440 A1 | 1/2012 | Segall et al. |
| 2012/0014444 A1 | 1/2012 | Min et al. |
| 2012/0057630 A1 | 3/2012 | Saxena et al. |
| 2012/0084821 A1 | 4/2012 | Rogers |
| 2012/0110443 A1 | 5/2012 | Lemonik et al. |
| 2012/0147140 A1 | 6/2012 | Itakura et al. |
| 2012/0206562 A1 | 8/2012 | Yang et al. |
| 2012/0287999 A1 | 11/2012 | Li et al. |
| 2012/0290900 A1 | 11/2012 | Paniconi |
| 2012/0320975 A1 | 12/2012 | Kim et al. |
| 2012/0320984 A1 | 12/2012 | Zhou |
| 2013/0031441 A1 | 1/2013 | Ngo et al. |
| 2013/0044183 A1 | 2/2013 | Jeon et al. |

FOREIGN PATENT DOCUMENTS

| | | |
|---|---|---|
| WO | WO0249356 | 6/2002 |
| WO | WO2008006062 | 1/2008 |

OTHER PUBLICATIONS

Frossard, Pascal; "Joint Source/FEC Rate Selection for Quality-Optimal MPEG-2 Video Delivery", IEEE Transactions on Image Processing, vol. 10, No. 12, (Dec. 2001) pp. 1815-1825.

International Search Report and Written Opinion for International Application No. PCT/US2011/051818 dated Nov. 21, 2011 (16 pages).

Korhonen, Jari; Frossard, Pascal; "Flexible forward error correction codes with application to partial media data recovery", Signal Processing: Image Communication vol. 24, No. 3 (Mar. 2009) pp. 229-242.

Li, A., "RTP Payload Format for Generic Forward Error Correction", Network Working Group, Standards Track, Dec. 2007, (45 pp).

Liang, Y.J.; Apostolopoulos, J.G.; Girod, B., "Analysis of packet loss for compressed video: does burst-length matter?," Acoustics, Speech and Signal Processing, 2003. Proceedings. (ICASSP '03). 2003 IEEE International conference on, vol. 5, No., pp. V, 684-7 vol. 5, Apr. 6-10, 2003.

Roca, Vincent, et al., Design and Evaluation of a Low Density Generator Matrix (LDGM) Large Block FEC Codec, INRIA Rhone-Alpes, Planete project, France, Date Unknown, (12 pp).

Wikipedia, the free encyclopedia, "Low-density parity-check code", http://en.wikipedia.org/wiki/Low-density_parity-check_code, Jul. 30, 2012 (5 pp).

Yoo, S. J.B., "Optical Packet and burst Switching Technologies for the Future Photonic Internet," Lightwave Technology, Journal of, vol. 24, No. 12, pp. 4468, 4492, Dec. 2006.

Yu, Xunqi, et al; "The Accuracy of Markov Chain Models in Predicting Packet-Loss Statistics for a Single Multiplexer", IEEE Transaactions on Information Theory, vol. 54, No. 1 (Jan. 2008) pp. 489-501.

Chen, Yu, et al., "An Error Concealment Algorithm for Entire Frame Loss in Video Transmission," Picture Coding Symposium, 2004.

European Search Report for European Patent Application No. 08146463.1 dated Jun. 23, 2009.

Feng, Wu-chi; Rexford, Jennifer; "A Comparison of Bandwidth Smoothing Techniques for the Transmission of Prerecorded Compressed Video", Paper, 1992, 22 pages.

Han et al., "Jointly Optimized Spatial Prediction and Block Transform for Video and Image Coding," IEEE Transactions on Image Processing, vol. 21, No. 4 (Apr. 2012).

Hartikainen, E. and Ekelin, S. Tuning the Temporal Characteristics of a Kalman-Filter Method for End-to-End Bandwidth Estimation. IEEE E2EMON. Apr. 3, 2006.

International Search Report for International Application No. PCT/EP2009/057252 mailed on Aug. 27, 2009.

JongWon Kim, Young-Gook Kim, HwangJun Song, Tien-Ying Kuo, Yon Jun Chung, and C.-C. Jay Kuo; "TCP-friendly Internet Video Streaming employing Variable Frame-rate Encoding and Interpolation"; IEEE Trans. Circuits Syst. Video Technology, Jan. 2000; vol. 10 pp. 1164-1177.

(56) References Cited

OTHER PUBLICATIONS

Khronos Group Inc. OpenMAX Integration Layer Application Programming Interface Specification. Dec. 16, 2005, 326 pages, Version 1.0.
Neogi, A., et al., Compression Techniques for Active Video Content; State University of New York at Stony Brook; Computer Science Department; pp. 1-11.
Peng, Qiang, et al., "Block-Based Temporal Error Concealment for Video Packet Using Motion Vector Extrapolation," IEEE 2003 Conference of Communications, Circuits and Systems and West Sino Expositions, vol. 1, No. 29, pp. 10-14 (IEEE 2002).
"Rosenberg, J. D. RTCWEB I-D with thoughts on the framework. Feb. 8, 2011. Retrieved fromhttp://www.ietf.org/mail-archive/web/dispatch/current/msg03383.html on Aug. 1, 2011."
"Rosenberg, J.D., et al. An Architectural Framework for Browser based Real-Time Communications (RTC) draft-rosenberg-rtcweb-framework-00. Feb. 8, 2011. Retrieved fromhttp://www.ietf.org/id/draft-rosenberg-rtcweb-framework-00.txt on Aug. 1, 2011."
Scalable Video Coding, SVC, Annex G extension of H264.
Stiller, Christoph; "Motion-Estimation for Coding of Moving Video at 8 kbit/s with Gibbs Modeled Vectorfield Smoothing", SPIE vol. 1360 Visual Communications and Image Processing 1990, 9 pp.
Yan, Bo and Gharavi, Hamid, "A Hybrid Frame Concealment Algorithm for H.264/AVC," IEEE Transactions on Image Processing, vol. 19, No. 1, pp. 98-107 (IEEE, Jan. 2010).
Chae-Eun Rhee et al. (:A Real-Time H.264/AVC Encoder with Complexity-Aware Time Allocation, Circuits and Systems for video Technology, IEEE Transactions on, vol. 20, No. 12, pp. 1848, 1862, Dec. 2010).
Gachetti (Matching techniques to compute image motion, Image and Vision Computing, vol. 18, No. 3, Feb. 2000, pp. 247-260.
Sony. "PlayStation® Move Motion Controller", published online at [http//us.playstation.com/ps3/playstation-move/], retrieved Mar. 14, 2012, 4 pages.
Microsoft. "Xbox 360 + Kinect", published online at :[http://www.xbox.com/en=US/kinect], retrieved Mar. 14, 2012. 2 pages.
"Series H: Audiovisual and Multimedia Systems; Infrastructure of audiovisual services—Coding of moving video; Advanced video coding for generic audiovisual services". H.264. Version 1. International Telecommunication Union. Dated May, 2003.
"Series H: Audiovisual and Multimedia Systems; Infrastructure of audiovisual services—Coding of moving video; Advanced video coding for generic audiovisual services". H.264. Version 3. International Telecommunication Union. Dated Mar. 2005.
"Overview; VP7 Data Format and Decoder". Version 1.5. On2 Technologies, Inc. Dated Mar. 28, 2005.
"Series H: Audiovisual and Multimedia Systems; Infrastructure of audiovisual services—Coding of moving video; Advanced video coding for generic audiovisual services". H.264. Amendment 1: Support of additional colour spaces and removal of the High 4:4:4 Profile. International Telecommunication Union. Dated Jun. 2006.
"VP6 Bitstream & Decoder Specification". Version 1.02. On2 Technologies, Inc. Dated Aug. 17, 2006.
"Series H: Audiovisual and Multimedia Systems; Infrastructure of audiovisual services—Coding of moving video". H.264. Amendment 2: New profiles for professional applications. International Telecommunication Union. Dated Apr. 2007.
"VP6 Bitstream & Decoder Specification". Version 1.03. On2 Technologies, Inc. Dated Oct. 29, 2007.
"Series H: Audiovisual and Multimedia Systems; Infrastructure of audiovisual services—Coding of moving video". H.264. Advanced video coding for generic audiovisual services. Version 8. International Telecommunication Union. Dated Nov. 1, 2007.
"Series H: Audiovisual and Multimedia Systems; Infrastructure of audiovisual services—Coding of moving video". H.264. Advanced video coding for generic audiovisual services. International Telecommunication Union. Version 11. Dated Mar. 2009.
"Series H: Audiovisual and Multimedia Systems; Infrastructure of audiovisual services—Coding of moving video". H.264. Advanced video coding for generic audiovisual services. International Telecommunication Union. Version 12. Dated Mar. 2010.
"Implementors' Guide; Series H: Audiovisual and Multimedia Systems; Coding of moving video: Implementors Guide for H.264: Advanced video coding for generic audiovisual services". H.264. International Telecommunication Union. Version 12. Dated Jul. 30, 2010.
"VP8 Data Format and Decoding Guide". WebM Project. Google On2. Dated: Dec. 1, 2010.
Bankoski et al. "VP8 Data Format and Decoding Guide; draft-bankoski-vp8-bitstream-02" Network Working Group. Dated May 18, 2011.
Bankoski et al. "Technical Overview of VP8, an Open Source Video Codec for the Web". Dated Jul. 11, 2011.
Bankoski, J., Koleszar, J., Quillio, L., Salonen, J., Wilkins, P., and Y. Xu, "VP8 Data Format and Decoding Guide", RFC 6386, Nov. 2011.
Mozilla, "Introduction to Video Coding Part 1: Transform Coding", Video Compression Overview, Mar. 2012, 171 pp.
Han et al., "Toward Jointly Optimal Spatial Prediction and Adaptive Transform in Video/Image Coding," ICASSP 2010 (Dallas, TX, Mar. 14-19, 2010).
Wright, R. Glenn, et al.; "Multimedia—Electronic Technical Manual for ATE", IEEE 1996, 3 pp.

* cited by examiner

| 130 | | | | | | | | | | | | 134 | | | | | | | | 132 | | | |
|---|---|---|---|---|---|---|---|---|---|---|---|---|---|---|---|
| 100 | 91 | 82 | 65 | 64 | 63 | 62 | 61 | 60 | 59 | 58 | 57 | 109 | 118 | 127 | 136 |
| 101 | 92 | 83 | 66 | 37 | 36 | 35 | 34 | 33 | 32 | 31 | 56 | 110 | 119 | 128 | 137 |
| 102 | 93 | 84 | 67 | 38 | 17 | 16 | 15 | 14 | 13 | 30 | 55 | 111 | 120 | 129 | 138 |
| 103 | 94 | 85 | 68 | 39 | 18 | 5 | 4 | 3 | 12 | 29 | 54 | 112 | 121 | 130 | 139 |
| 104 | 95 | 86 | 69 | 40 | 19 | 6 | 1 | 2 | 11 | 28 | 53 | 113 | 122 | 131 | 140 |
| 105 | 96 | 87 | 70 | 41 | 20 | 7 | 8 | 9 | 10 | 27 | 52 | 114 | 123 | 132 | 141 |
| 106 | 97 | 88 | 71 | 42 | 21 | 22 | 23 | 24 | 25 | 26 | 51 | 115 | 124 | 133 | 142 |
| 107 | 98 | 89 | 72 | 43 | 44 | 45 | 46 | 47 | 48 | 49 | 50 | 116 | 125 | 134 | 143 |
| 108 | 99 | 90 | 73 | 74 | 75 | 76 | 77 | 78 | 79 | 80 | 81 | 117 | 126 | 135 | 144 |

VIDEO ENCODING AND DECODING USING UN-EQUAL ERROR PROTECTION

TECHNICAL FIELD

This disclosure relates to video encoding and decoding and particularly to video coding using un-equal error protection.

BACKGROUND

Digital video streams represent video using a sequence of still images, called "frames." Modern video coding techniques can efficiently compress the video stream for many applications such as video conferencing and streaming through bandwidth-limited communication channels. However, packet loss and error may occur during video bitstream transmission, resulting in errors in decoding the bitstream.

SUMMARY

This disclosure includes aspects of systems, methods and apparatuses for encoding and decoding video signals that include error protection so as to achieve high quality video communications and other types of applications under packet loss or error conditions. One aspect of a disclosed implementation is a method for encoding a video stream including a plurality of video frames, each frame including a plurality of blocks. The method includes selecting a first block substantially central to a frame and then selecting subsequent blocks in a substantially spiral manner such that each subsequent block adjoins a previously selected block. Selection continues until the selected blocks form a contiguous group of blocks occupying at least a central section of the frame. The selected blocks are encoded in an order in which the selected blocks were selected. The method applies a first level of error protection to encoded blocks within the central section, and applies a second level of error protection, different than the first level of error protection, to encoded blocks outside the central section of the frame.

Another aspect of a disclosed implementation is an apparatus for encoding a video stream. The apparatus includes memory and at least one processor programmed to execute instructions contained in the memory. The instructions cause the processor to select a first block substantially central to a frame and then select subsequent blocks in a substantially spiral manner such that each subsequent block adjoins a previously selected block, continue the selecting of subsequent blocks until the selected blocks form a contiguous group of blocks occupying at least a central section of the frame, encode the selected blocks in an order in which the selected blocks were selected, apply a first level of error protection to encoded blocks within the central section, and if any encoded blocks are located outside the central section, apply a second level of error protection, different than the first level of error protection, to the encoded blocks outside the central section.

Another aspect of a disclosed implementation is a method for decoding a video stream. This method includes receiving a bitstream of encoded blocks associated with a frame, and decoding the encoded blocks in an order corresponding to a first block substantially central to the frame, a second block adjacent to the first block, and subsequent blocks adjacent to a previously selected block in a spiral manner. Responsive to data errors affecting decoding of a block of the encoded blocks, the method performs data recovery operations. The recovery operations include attempting recovery of data related to the block using a first level of error protection when the block resides within a central section of the frame, the central section of the frame including at least a contiguous set of blocks about a center of the frame, and if the block resides outside the central section, attempting recovery of data related to the block using a second level of error protection, the second level of protection different than the first level, or skipping recovery of the data related to the block.

Another aspect of a disclosed implementation is an apparatus for decoding a video. The apparatus includes digital data storage and at least one processor programmed to execute instructions contained in the digital data storage. The instructions cause the processor to receive a bitstream of encoded blocks associated with a frame and decode the encoded blocks wherein the encoded blocks are encoded in an order corresponding to a first block substantially central to the frame, a second block adjacent to the first block, and subsequent blocks adjacent to a previously selected block in a spiral manner. Responsive to data errors affecting decoding of a block of the encoded blocks, the processor performs data recovery by attempting recovery of data related to the block using a first level of error protection when the block resides within a central section of the frame, the central section of the frame including at least a contiguous set of blocks about a center of the frame. If instead the block resides outside the central section, the processor performs one of attempting recovery of data related to the block using a second level of error protection, the second level of protection different than the first level of error protection, or skipping recovery of the data related to the block.

These and other aspects are described in additional detail below.

BRIEF DESCRIPTION OF THE DRAWINGS

This disclosure refers to the accompanying drawings, where like reference numerals refer to like parts throughout the several views and wherein:

FIG. 7 is a diagram showing the image frame of FIG. 6 with blocks labeled in the order in which those blocks are selected for encoding;

DETAILED DESCRIPTION

Figure 1:
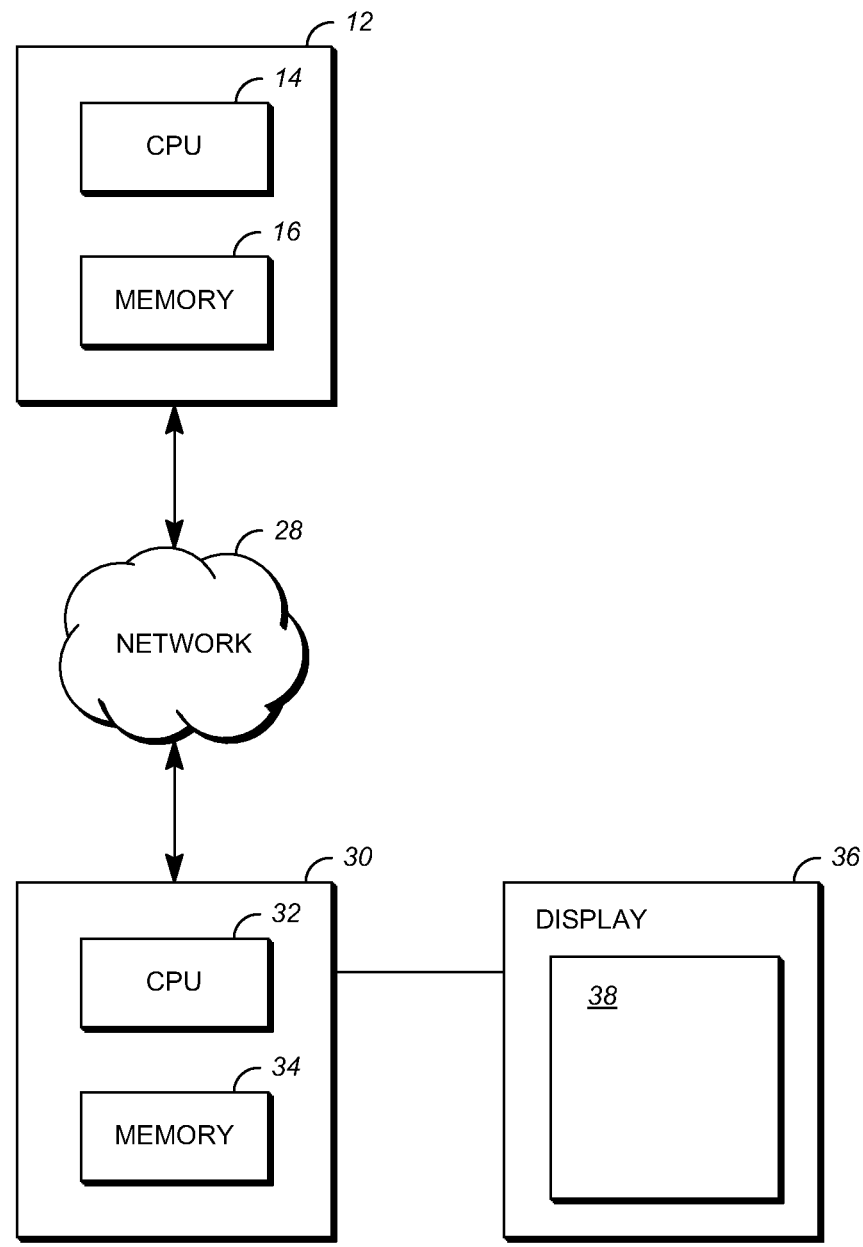
FIG. 1 is a schematic of a video encoding and decoding system in which aspects of the invention can be implemented.

Digital video is used for various purposes, with some examples including remote business meetings via video conferencing, high definition video entertainment, video advertisements, and sharing of user-generated videos. As technology evolves, users obtain higher expectations for video quality; they expect high resolution video even for video transmitted over communications channels of limited bandwidth.

To permit transmission of digital video streams while limiting bandwidth consumption, video encoding and decoding schemes incorporate various compression schemes. These compression schemes generally break the image up into blocks and use one or more techniques to limit the information included in a resulting digital video bitstream for transmission. The bitstream, once received, can be decoded to re-create the blocks and the source images from the limited information.

Noisy communications channels between an encoder and decoder can corrupt transmitted data, resulting in degraded video performance and a decrease in perceived video quality. One way to address this is to trade bit rate for additional error correction information. Even with somewhat less resolution in either spatial resolution or dynamic range, the resultant image can yield a perceived image quality that is greater than if the tradeoff was not made under packet-loss conditions. In dynamic error correction, a maximum bit rate for a given communications channel may be determined experimentally or known a priori. The decoder or another component with knowledge of the communications channel can determine the error rate of the communications channel and advise the encoder as to how much bandwidth should be allotted for error correction to assure a desired level of video quality. The encoder can adjust the resolution of the encoding process according to the equation:

$$B_T - B_E = B_{IR}; \text{ where}$$

$B_T$ is the total bandwidth available for use in the communications channel;
$B_E$ is the bandwidth to be used for error correction; and
$B_{IR}$ is the bandwidth to be used to transmit an image I at a resolution R.

In one dynamic error correction scheme, a number of blocks for an image are transmitted and the communications channel error rate is measured on a periodic or other basis. Based on these calculations, a change in $B_E$ is made, and hence a change to $B_{IR}$. While such a scheme typically avoids dropped frames or other synchronization problems, the image degradation caused by reduced bit rate can interfere with perceived image quality, e.g., when the viewer is interested in the portion of the image that is subject to reduced image quality when higher requirements for error correction bandwidth result in reduced bandwidth for the image.

In some real-time video communication systems, constant bitrate is utilized to fit channel bandwidth. However, constant bitrate can be difficult to achieve in practice, and it generally calls for the quantization levels to change constantly during the block encoding process for every image in the video sequence. One challenge is that due to the limited bit budget, conventional techniques increase quantization levels for the latter-encoded blocks in an image in order to achieve the desired bitrate. This can reduce the picture quality for these latter-encoded blocks, in some cases resulting in uneven image quality when encoding in raster scan order. This uneven quality of the image can be annoying to the viewers.

Another challenge with noisy communications channels between an encoder and decoder is that portions of the transmitted bitstream can be corrupted or entirely lost, also potentially resulting in degraded video performance and a decrease in perceived video quality.

One or more aspects of this disclosure address these and other challenges by limiting the potentially reduced quality of interesting areas of an image such as a central section of the image during the encoding process so as to maintain perceived image quality. Herein, an interesting area of an image is defined as a portion of an image that may contain image data of actual or predicted interest to a viewer such as the face of a person talking in a video frame.

FIG. 1 is a schematic of a video encoding and decoding system 10 in which aspects of the invention can be implemented. A transmitting station 12, in one example, includes a computer with an internal configuration of hardware including a processor such as a central processing unit (CPU) 14 and a digital data storage exemplified by memory 16. CPU 14 is a controller for controlling the operations of transmitting station 12, and may be exemplified by a microprocessor, digital signal processor, field programmable gate array, discrete circuit elements laid out in a custom application specific integrated circuit (ASIC), or any other digital data processor appropriate to the application at hand. CPU 14 is connected to memory 16 by a memory bus, wires, cables, wireless connection, or any other connection appropriate to the remainder of this disclosure. Memory 16 may be or include read-only memory (ROM), random access memory (RAM), dynamic RAM, optical storage, magnetic storage such as disk or tape, or any other manner or combination of suitable digital data storage device or devices. Memory 16 can store data and program instructions that are used by CPU 14. Other suitable implementations of transmitting station 12 are possible. For example, the processing of transmitting station 12 can be distributed among multiple devices.

In one example, a network 28 connects transmitting station 12 and a receiving station 30 for encoding and decoding of the video stream. In one example, the video stream is encoded in transmitting station 12 and the encoded video stream is decoded in receiving station 30. Network 28 may include any network that is appropriate to the application at hand, such as the public Internet, corporate or other Intranet, local or wide area network, virtual private network, Token Ring, cellular telephone data network, or any other wired or wireless configuration of hardware, software, communication protocol suitable to transfer the video stream from transmitting station 12 to receiving station 30 in the illustrated example.

Receiving station 30 includes a CPU 32 and memory 34, exemplified by similar components as discussed above in conjunction with the system 12. A display 36 is configured to display a video stream. Display 36 can be connected to receiving station 30 and can be implemented in various ways, including by a liquid crystal display (LCD), a cathode-ray tube (CRT), organic or non-organic light emitting diode display (LED), plasma display, or any other mechanism to display a machine-readable video signal to a user. Display 36 can be configured to display a rendering 38 of the video stream decoded by a decoder in receiving station 30.

Other implementations of encoder and decoder system 10 are possible. In the implementations described, for example, an encoder is implemented in transmitting station 12 and a decoder is implemented in receiving station 30 as instructions in memory or a component separate from memory. However, an encoder or decoder can be coupled to a respective station 12, 30 rather than be located within it. Further, one implementation can omit network 28 and/or display 36. In another implementation, a video stream can be encoded and then stored for transmission at a later time to receiving station 30 or any other device having memory. In another implementation, additional components can be added to encoder and decoder system 10. For example, a display or a video camera can be attached to transmitting station 12 to capture the video stream to be encoded.

In an exemplary implementation, the real-time transport protocol (RTP) is used for transmission of the bitstream. In another implementation, a transport protocol other than RTP may be used, such as an HTTP-based video streaming protocol.

Figure 2:
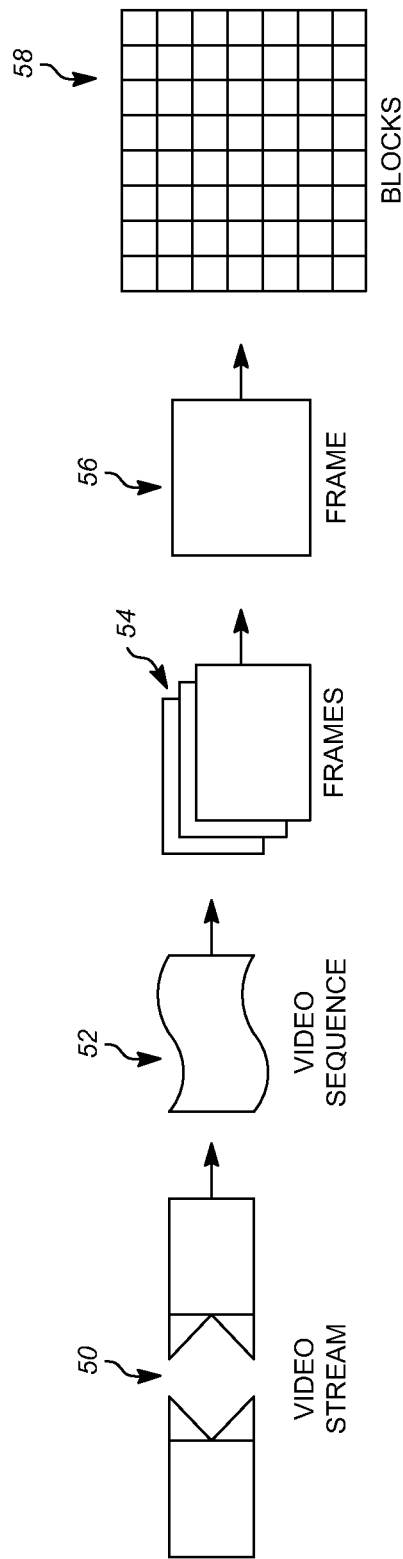
FIG. 2 is a diagram of a video stream to be encoded and decoded.

FIG. 2 is a diagram of an exemplary video stream 50 to be encoded and subsequently decoded. Video stream 50 includes a video sequence 52. Video sequence 52 includes a number of adjacent frames 54. While three frames are depicted in adjacent frames 54, video sequence 52 can include any number of adjacent frames. A single example of the adjacent frames 54 is illustrated as the single frame 56. At the next level, single frame 56 can be divided into a series of blocks 58. In a specific example, blocks 58 contain data corresponding to 16×16 pixels in frame 56, such as luminance and chrominance data for the corresponding pixels. Blocks 58 can also be of any other suitable size such as 16×8 pixel groups or 8×16 pixel groups. Unless otherwise noted, the terms block and macroblock are used interchangeably herein.

Figure 3:
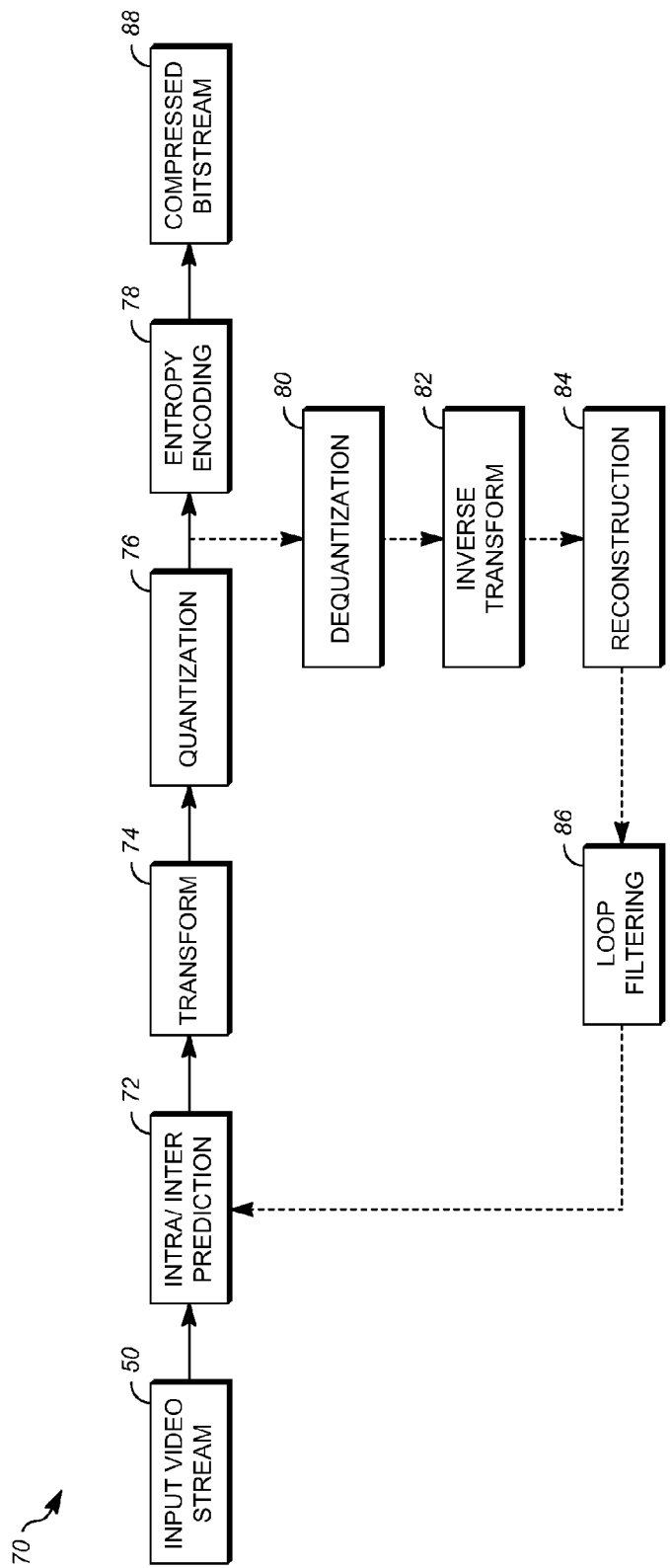
FIG. 3 is a block diagram of a video compression system according to an implementation.

FIG. 3 is a block diagram of an encoder 70 in accordance with an implementation. Encoder 70 can be implemented, as described above, in transmitting station 12. Encoder 70 encodes an input video stream 50. Encoder 70 has the following stages to perform the various functions in a forward path (shown by the solid connection lines) to produce an encoded and/or a compressed bitstream 88: an intra/inter prediction stage 72, a transform stage 74, a quantization stage 76, and an entropy encoding stage 78. Encoder 70 may also include a reconstruction path (shown by the dotted connection lines) to reconstruct a frame for prediction and encoding of future blocks. In FIG. 3, encoder 70 includes the following stages to perform the various functions in the reconstruction path: a dequantization stage 80, an inverse transform stage 82, a reconstruction stage 84, and a loop filtering stage 86. Other structural variations of encoder 70 can be used to encode video stream 50.

When video stream 50 is presented for encoding, each frame (such as frame 56 from FIG. 2) within video stream 50 is processed in units of blocks. At intra/inter prediction stage 72, each block can be encoded using either intra-frame prediction or inter-frame prediction. Inter-frame prediction occurs within a single frame, whereas inter-frame prediction occurs from frame to frame. In either case, a prediction block can be formed. In the case of intra-prediction, a prediction block can be formed from samples in the current frame that have been previously encoded and reconstructed. In the case of inter-prediction, a prediction block can be formed from samples in one or more previously constructed reference frames.

Next, still referring to FIG. 3, the prediction block can be subtracted from the current block at intra/inter prediction stage 72 to produce a residual block, also referred to as a "residual." Transform stage 74 transforms the residual into transform coefficients in, for example, the frequency domain. Examples of block-based transforms include the Karhunen-Loève Transform (KLT), the Discrete Cosine Transform ("DCT"), and the Singular Value Decomposition Transform ("SVD") to name a few. In one example, the DCT transforms the block into the frequency domain. In the case of DCT, the transform coefficient values are based on spatial frequency, with the DC or other lowest frequency coefficient at the top-left of the matrix and the highest frequency coefficient at the bottom-right of the matrix.

Quantization stage 76 converts the transform coefficients into discrete quantum values, which are referred to as quantized transform coefficients. The quantized transform coefficients are then entropy encoded by entropy encoding stage 78. The entropy-encoded coefficients, together with other information used to decode the block, such as the type of prediction used, motion vectors and quantizer value, are then output to a compressed bitstream 88. Compressed bitstream 88 can be formatted using various techniques, such as variable length coding (VLC) and arithmetic coding.

The reconstruction path in FIG. 3, shown by the dotted connection lines, can be used to help ensure that both encoder 70 and a decoder 100 (described below with reference to FIG. 4) use the same reference frames to decode compressed bitstream 88. The reconstruction path performs functions that are similar to functions that take place during the decoding process that are discussed in more detail below, including dequantizing the quantized transform coefficients at dequantization stage 80 and inverse transforming the dequantized transform coefficients at inverse transform stage 82 to produce a derivative residual block, referred to as a "derivative residual." At reconstruction stage 84, the prediction block that was predicted at intra/inter prediction stage 72 can be added to the derivative residual to create a reconstructed block. Loop filtering stage 86 can be applied to the reconstructed block to reduce distortion such as blocking artifacts.

Other variations of encoder 70 can be used to encode compressed bitstream 88. For example, a non-transform based encoder 70 can quantize the residual signal directly without transform stage 74. In another implementation, an encoder 70 may have quantization stage 76 and dequantization stage 80 combined into a single stage.

Figure 4:
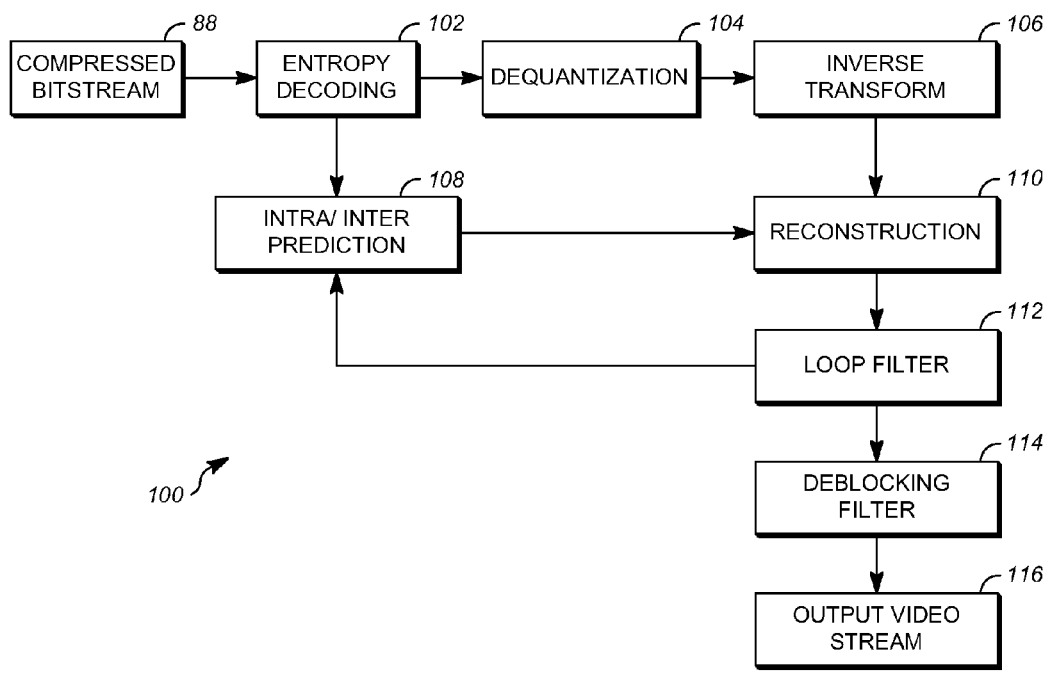
FIG. 4 is a block diagram of a video decompression system according to an implementation.

FIG. 4 is a block diagram of decoder 100 in accordance with an implementation of this disclosure. In one example, decoder 100 can be implemented in receiving station 30. Decoder 100 includes in one example the following stages to perform various functions to produce an output video stream 116 from compressed bitstream 88: an entropy decoding stage 102, a dequantization stage 104, an inverse transform stage 106, an intra/inter prediction stage 108, a reconstruction stage 110, a loop filtering stage 112 and a deblocking filtering stage 114. Other structural variations of decoder 100 can be used to decode compressed bitstream 88.

When compressed bitstream 88 is presented for decoding, the data elements within compressed bitstream 88 can be decoded by entropy decoding stage 102 to produce a set of quantized transform coefficients. Dequantization stage 104 dequantizes the quantized transform coefficients, and inverse transform stage 106 inverse transforms the dequantized transform coefficients to produce a derivative residual that can be identical to that created by inverse transform stage 82 in encoder 70. Using header information decoded from compressed bitstream 88, decoder 100 can use the intra/inter prediction stage 108 to create the same prediction block as was created in encoder 70. At reconstruction stage 110, the prediction block can be added to the derivative residual to create a reconstructed block. Loop filtering stage 112 can be applied to the reconstructed block to reduce blocking artifacts. Deblocking filtering stage 114 can be applied to the reconstructed block to reduce blocking distortion, and the result is output as output video stream 116.

Other variations of decoder 100 can be used to decode compressed bitstream 88. For example, decoder 100 can produce output video stream 116 without deblocking filtering stage 114.

Blocks are conventionally formed and processed in raster scan order, meaning that a block is formed from the upper left corner of the image by, for example, sixty-four pixels in an 8×8 window starting at the upper left corner of the image. The next block is formed by 64 pixels in an 8×8 window located by stepping over eight pixels in the horizontal direction and so forth. Once a row is completed, the next row of blocks is formed by stepping down eight pixels in the vertical direction starting from the upper left corner of the image and then proceeding in the horizontal direction as described above. Each row of blocks is formed in a like manner. In general, raster scan block schemes do not provide a mechanism to dynamically change error correction/bit rate tradeoffs to provide increased protection for particular regions in a frame.

This disclosure provides improved image encoding and decoding with dynamic error correction by altering the order in which image blocks are processed and transmitted. For many video streams, the most important part of the image frame is the central portion, with the outer edges typically containing less interesting image data. An example of this would be images from a video conferencing system, where the images are principally pictures of faces occupying the central portion of the image. In implementations of this disclosure, the residual quantization and coding process starts from the blocks at the center of the image rather than the top-left corner of the image. The subsequent blocks are scanned in a spiral manner. This way, the image quality degradation due to bit budget is applied to the outer part of the image so as to create a visually more pleasant image. This approach optionally allows more bit budget to be distributed to the center section of image without concern for the potential image quality problems later. Moreover, designating blocks in this way can allow different levels of error protection to be applied to different parts of the frame.

Figure 5:
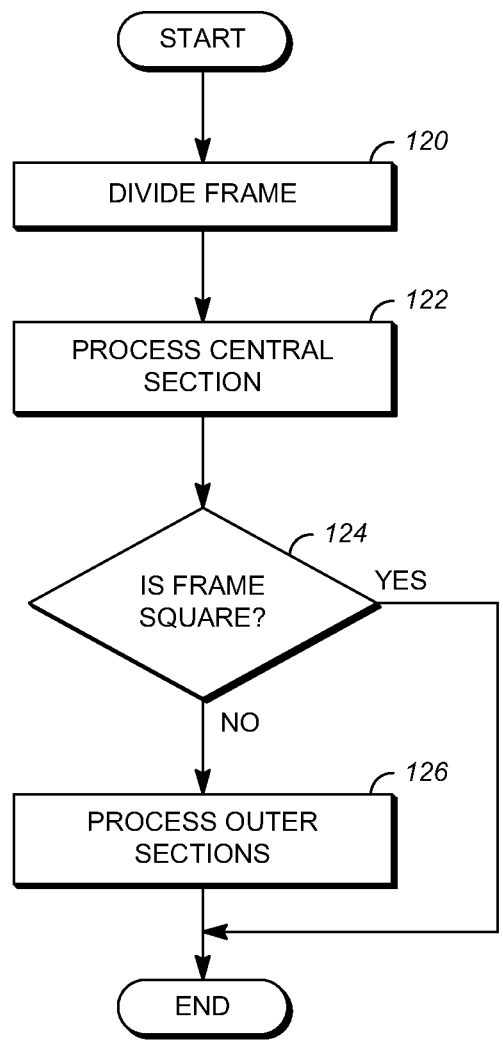
FIG. 5 is a flowchart showing processing according to an implementation.

FIG. 5 is a flowchart showing processing operations according to an implementation. The processing of FIG. 5 is performed by encoder 70 in this implementation and starts by dividing a frame 56 into one or more sections in step 120. In one example, intra/inter prediction stage 72 may divide frame 56 into blocks 58, and then divide/sort blocks 58 into one or more sections for subsequent processing. Assuming that frame 56 is an array of pixels that are formed into M×N blocks, and each macroblock uses the same quantization value or matrix for residual quantization, step 120 divides frame 56 by forming a central square section and, if needed, outer sections. If M>N, then (M−N)/2 macroblock columns can be stripped from the left-most columns of frame 56 and ((M−N)−(M−N)/2) macroblock columns can be stripped from the right-most columns of frame 56 to form a central square section. In contrast, where N>M, then (N−M)/2 macroblock rows can be stripped from the top-most rows of frame 56 and ((N−M)−(N−M)/2) macroblock rows can be stripped from the bottom-most rows of frame 56 to form a central square section. In either case, the remaining N×N macroblocks in the center of frame 256 can form the first part for quantization in the following steps. The values obtained by division can be truncated or rounded.

Figure 6:
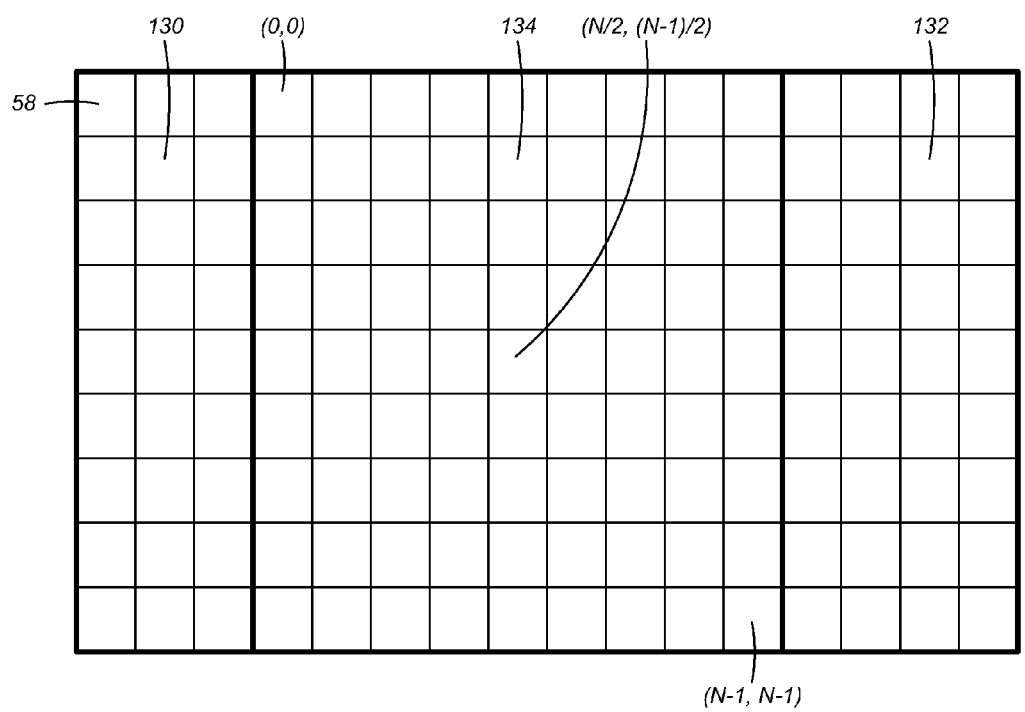
FIG. 6 is a diagram showing an image frame divided according to the processing of FIG. 5.

FIG. 6 is a diagram showing an image frame 56 divided according to the processing of FIG. 5. Frame 56 includes an array of pixels that are formed into 16×9 blocks. Typically, the pixel array ranges in size from 160 to 1920 pixels along one dimension and from 120 to 960 pixels along the other dimension, while the blocks 58 each includes 16×16 pixels. Smaller or larger arrays and blocks 58 are possible. In this example, M is equal to 16 and N is equal to 9, so three columns are stripped from the left-most columns to form a first outer or left side section 130, four columns are striped from the right-most columns to form a second outer or right side section 132, and the remaining N×N blocks for a central section 134. Note that a frame may be taller than it is wide and therefore first outer section 130 and second outer section 132 may be respectively at the top and bottom of central section 134. In one implementation, outer sections 130, 132 are further split into two or more sections each.

Referring again to FIG. 5, processing advances to step 122 after dividing frame 56 into sections in step 120. In step 122, central section 134 is processed by scanning in a spiral fashion to form an orderly stream of blocks to be encoded. In one example, the scan starts from the center-most macroblock and proceeds along either a clockwise or a counter-clockwise path.

To provide one example, a counter-clock-wise spiral scan is described with reference to FIG. 6. Assuming the N×N macroblock array index of central portion 134 proceeds from 0 to N−1, where (0,0) represents the block at the top-left corner while (N−1, N−1) represents the block at the bottom-right corner, then the starting macroblock index is calculated by (N/2, (N−1)/2), where the division is an integer operation with truncation. For a 5×5 array of macroblocks, the scan order can be represented by: (2,2), (2,3), (1,3), (1,2), (1,1), (2,1), (3,1), (3,2), (3,3) (3,4), (2,4), (1,4), (0,4), (0,3), (0,2), (0,1), (0,0), (1,0), (2,0), (3,0), (4,0), (4,1), (4,2), (4,3), (4,4). This scan ends at the bottom-right corner. For a 4×4 array of macroblocks, the scan order can be represented by (2,1), (2,2), (1,2), (1,1), (1,0), (2,0), (3,0), (3,1), (3,2), (3,3), (2,3), (1,3), (0,3), (0,2), (0,1), (0,0). This scan ends at the top-left corner. In general, given the defined starting point and the scan order, the end-point will be the bottom-right corner if N is an odd number, while the end-point will be top-left corner if N is an even number. Alternative implementations may include modified spiral scans such as combining a clockwise scan with counter-clockwise scan in the same frame. Moreover, a different starting point rather than a center point at (N/2, (N−1)/2) could be selected as long as it is substantially near the center point. Whether the starting point is substantially near the center point could depend on the value of N where larger values of N would better tolerate starting further from the center point.

The blocks so selected can be encoded as described with respect to the operation of encoder 70. After processing central section 134 in step 122 of FIG. 5, processing advances to step 124 to determine whether frame 56 is square. Frame 56 is square if M=N. In such a case, there are no outer sections 130, 132 to be processed. The routine of FIG. 5 then ends. If frame 56 is not square, processing advances to step 126 to process the outer sections before ending the routine of FIG. 5. Some processes can occur in different orders and/or concurrently with other processes from what is depicted and described above. For example, in one implementation, the determination of whether frame 56 is square could be made after dividing frame 56 into blocks but before dividing frame 56 into a central section and outer sections.

In one example, less emphasis may be placed on the order in which the blocks are selected for encoding from the edges of frame 56, in comparison to the order in which blocks are selected from central section 134 when it is assumed that less important image information resides in the edges. According to one implementation in a counter-clockwise spiral scan for a central section, the left strip is scanned and coded first. If the left strip contains multiple macroblock columns, the scanning can start from the inner column first, connecting the last macroblock of the last scanned macroblock in the N×N central section of the frame. After the left columns are scanned and coded, the columns of macroblocks in the right strip are scanned and coded. The start point of the right strip scan can start from its left-most column, from the top to the bottom, and then can proceed from the next column on the right, from bottom to top. This process is repeated until all the macroblocks are scanned and coded. In an example, the right strip may be scanned first where the spiral scan is a clockwise scan. In a different example, the right strip is scanned and coded first when the scan order is counter-clockwise or the left strip is scanned and coded first when the scan order is clockwise. The blocks of the outer strips, whether located on the left and right or the top and bottom can be scanned and coded in different orders after processing the central section.

In the description above, the edge strips are scanned from top to bottom from columns closer to the central section to columns closer to the outer edges of the image frame where it is assumed M>N, but other scan patterns are possible. For example, instead of proceeding from top-to-bottom for the first column and then from bottom-to-top for the next column and so on, the scan could occur from bottom-to-top for the first column and then from top-to-bottom for the next column and so on. The scan could occur along each column from top-to-bottom or from bottom-to-top for all blocks of a strip. In one example, scanning could proceed in like patterns using left-to-right and/or right-to-left scanning of rows. Left-to-right and/or right-to-left scanning patterns of rows starting with rows closest to the central section is also an example. However, scanning the columns of top and bottom outer sections in top-to-bottom and/or bottom-to-top patterns is also possible.

Regardless of the scan order for the outer sections, the blocks so selected can be processed in step 126 by being encoded as described with respect to the operation of encoder 70.

FIG. 7 is a diagram showing image frame 56 of FIG. 6 with blocks labeled in the order in those blocks are selected for encoding according to an implementation. Spiral processing begins with selecting a block in the middle of central section 134, marked with a "1" in FIG. 7. The next block to be encoded is adjacent to the first block and is marked with a "2". The processing proceeds encoding blocks in a spiral, denoted in FIG. 7 by the numbers on the blocks. As can be seen in FIG. 7, spiral processing is able to continue until block "81" is reached, exhausting the blocks available in central section 134. Processing then continues with left side section 130 at block "82". From this point, blocks are emitted by traveling down columns from right to left until left side section 130 is exhausted at block "108". Processing then continues with right side section 132, beginning at block marked "109" and continuing until the last block "144" is selected and emitted for encoding and subsequent transmission. This is an example where the order of processing central section 134 is counter-clockwise. However, the scan order can be clockwise. Further, the order in which side sections 130, 132 are processed may be varied from this description, so this scan order is shown by example only.

In order to distinguish the different scan patterns such as regular scan from left to right then top to bottom from the spiral scan described herein, code words can be added in a header to indicate the different scan methods. That is, implementations can indicate to the encoding process whether or not a particular video stream or frame should be encoded using spiral scan or another scan order by keywords or a code embedded in the header for the stream or frame. This code can also be transmitted or stored along with the video stream or frame to indicate to the decoder that a spiral scan or other scan order was used in encoding and/or is to be used in decoding the video stream or frame.

Selecting image blocks to be encoded and transmitted in a spiral scan order beginning at or near the center of the image frame can facilitate image blocks containing the most important image information can be transmitted first. This spiral scan order can be utilized but not necessarily exclusively utilized for quantization control for the residual signals in quantization stage 76. For example, transform coefficients obtained from transform stage 74 are converted into discrete quantum values by application of quantization levels in quantization stage 76. The discrete quantum values may be referred to as quantized transform coefficients. The bits allowed for each of these conversions can be controlled by the position of the block in the stream so as to provide more resolution to blocks earlier in the stream and less to those later in the stream. For motion vector and other information coding in intra-inter prediction stage 72, one may still choose to use conventional motion vector prediction using a regular macroblock scan according to known techniques. That is, for example, a conventional partition technique can be used to code motion vectors and mode. A code may also be added to distinguish the different scan approaches for the motion vectors and for the quantization. This code can also be transmitted or stored along with the video stream or frame to indicate to the decoder which of the different scan approaches for the motion vectors, quantization, and the like are to be used in decoding the video stream or frame.

The spiral macroblock scan order described herein can also be applied to a slice or a segment of an image. In addition, the scan pattern can be extended to different regions of an image to apply different error protection levels in accordance with the teachings herein.

A compressed bitstream including the encoded residuals for the blocks transmitted in the scan order can include, as described above by example, codes indicating the scan order and the partitioning for generating motion vectors and other data used to decode the blocks. When presented for decoding, the data elements within the bitstream can be decoded to produce a set of quantized transform coefficients. The quantized transform coefficients are dequantized then inverse transformed to produce a derivative residual that can be identical to that created by inverse transform stage 82 in encoder 70. Header information decoded from the bitstream allows the decoder to create or select the same prediction block as was used in encoder 70 to generate the residual. The prediction block is then added to the residual to create a reconstructed block. These steps may be performed for each block of a frame to be decoded. Filters can be applied to reduce blocking artifacts and/or blocking distortion before rendering a decoded frame.

Figure 8:
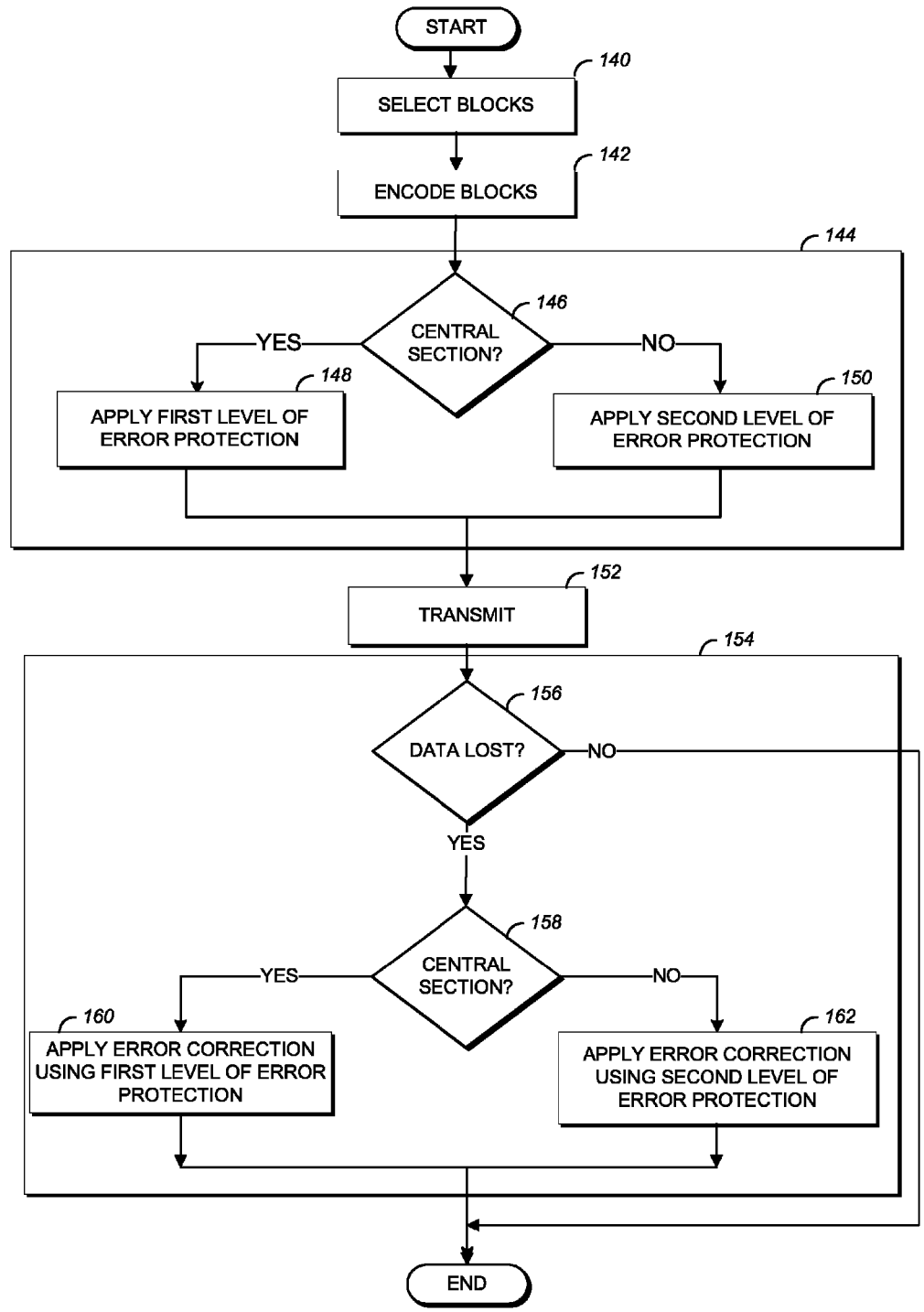
FIG. 8 is a flowchart showing encoding with selective error protection according to an implementation.

FIG. 8 shows a further aspect of this disclosure. FIG. 8 is a flowchart showing encoding with selective error protection according to an implementation. The processing of an exemplary frame is discussed, and it may be repeated as needed for all desired frames in the current video sequence or stream. For purposes of illustration, without any intended limitation, the processing is described in the context of the hardware and software components of FIGS. 1 and 3. In this example, the processing can be performed by CPU 14 and at least portions of encoder 70 coupled to or within CPU 14. In step 140, blocks of an image are identified and selected, and then encoding blocks occurs in step 142. According to one implementation, CPU 14 identifies and selects blocks according to the spiral scan technique described in detail with respect to FIGS. 5-7. According to the spiral scan technique, step 140 selects a first block substantially central to a frame, and then selects a second block adjacent to the first block, and then selects subsequent blocks adjacent to a previously selected block in a spiral manner until contiguous blocks of at least a central section of the frame are selected and encoded.

The central section may include any desired region, such as a rectangle, of the current frame. A representative frame 56 is discussed and illustrated in FIGS. 2, 6 and 7. In the current example, the central section is fixed so it does not change from frame to frame. In a different example, the extent of the central section may adjust over time according to user input, data transmission speed, occurrence of data transmission errors, predetermined schedule or pattern, or other factors.

In step 142, CPU 14 encodes the identified blocks in an order in which they were selected. Hence, encoding occurs for the central section first and then proceeds to the remainder of the frame. This operation may be carried out according to the encoding techniques explained in detail above. Encoding may further include the application of motion search and/or motion compensation processes. As a further enhancement, motion search and/or motion compensation may be performed selectively. As an example, for encoded blocks within the central section, step 142 may be performed using motion search and/or motion compensation based on data from blocks only within the central section. For blocks outside the central section, step 142 in this example is performed using motion search and/or motion compensation based on data from blocks inside and outside the central section.

The motion compensation process can in some cases have greater error resiliency for the inner part of the image while having greater coding efficiency for the outer part of the image. This can be achieved by allowing the image data in the outer part of the image to use the inner part of the image for motion search and motion compensation, while not allowing the image data in the inner part of the image to use the outer part of the image for motion search and motion compensation. This can help to prevent errors in the outer region from spreading into the inner region.

In one example, the motion vectors of the macroblocks within the central region are not permitted to go out of the boundary of that region. In this case, correct receipt of the bitstream containing only this region is decodable without the receipt of the other regions. In this example, the outer and likely less important regions will be able to use all the regions for prediction. Therefore, outside the central section, there is no restriction on the motion search region and motion vector range in this implementation. In some cases, this may be an advantage compared to a slice based approach where all slices are treated equally for motion search, motion vectors and other information. Due to the spiral scan, the center section of macroblocks are scanned and coded before the outer section(s) of macroblocks.

In various implementations, examples of error protection can be utilized depending upon the needs of the available computing resources and other details of the specific application at hand. In one example, the error protection scheme is coded into the programming of transmitting station 12. In a different example, the user of transmitting station 12 selects from various error protection schemes programmed into transmitting station 12. In still another example, the processing of FIG. 8 and/or FIG. 9 negotiates the selection error protection scheme.

Two examples of error protection are illustrated by optional steps 144 and 154 in FIG. 8. Step 144 implements error protection using the encoder, such as encoder 70, in the form of forward error correction (FEC) in this example. Step 154 implements error protection using the encoder in combination with signaling received from a decoder, such as decoder 100, in the form of retransmission of lost data in this example. The processing may be carried out using one or both of steps 144 and 154. Additionally, either step is optional.

Step 144, as illustrated, includes steps 146, 148 and 150. These steps can be performed for each block as it is encoded by step 142, after all blocks have been encoded or any other arrangement that is suitable considering the teachings of this disclosure and the application at hand. Step 146 considers a given block or group of blocks or all blocks, and asks whether the block or blocks reside within the designated central section of the current frame.

For data related to blocks residing within the central section, the encoder applies a first level of error protection in step 148. Otherwise, a second level of error protection is applied in step 150.

There are various examples of the first and second levels of error protection. In one example, the first level of error protection is forward error correction (FEC), and the second level of error protection is no error protection. In another example, the first level of error protection is forward error correction (FEC) applied to a first ratio or percentage of encoded blocks, and the second level of error protection includes forward error correction (FEC) applied to a second ratio or percentage of encoded blocks, where the first ratio is greater than the second ratio. For example, forward error correction may be applied to fifty percent of the encoded blocks within the central section and applied to twenty five percent of encoded blocks outside the central section, if any. Further examples of the first and second levels of error protection may be apparent to ordinarily skilled artisans having the benefit of this disclosure.

In step 152, CPU 14 transmits the encoded and optionally error protected bitstream. The protection of optional step 154 uses input from a source external to the encoder in order to implement different levels of error protection. Step 154, as illustrated, includes steps 156, 158, 160 and 162. These steps may be performed for each lost block, either individually or in a group along with other lost blocks. The further operations starting at step 154 are described in context of loss of a single data packet, where a data packet is a portion of the information needed to recreate one or more blocks, for ease of illustration. Step 154 starts with a query as to whether any data was lost in the transmission of step 152. For example, lost data in the form of a data packet may be indicated by a signal from receiving station 30 by an identification code of the packet (called "packet ID" hereinafter). Lost data can encompass data that is lost in its entirety or is corrupted in part or in its entirety, for example. If there is no lost data in response to the query of step 154, processing of the current frame is completed. Encoder 70 does not need to query decoder 100 as to whether data has been lost. For example, decoder 100 can transmit a signal that data was lost or corrupted upon occurrence that the encoder 70 can check as needed.

In the event of lost data, processing advances to step 158. For a given packet of data, the query in step 158 asks whether the data is associated with a block residing within in interesting region of the frame (e.g. the central section of the frame). If so, error correction is applied using a first level of error protection in step 160. Otherwise, if the block resides outside the central section, error correction is applied using a second level of error protection in step 162. In one example, the first level of error protection includes retransmitting the lost data packet from transmitting station 12 responsive to a request for retransmission from receiving station 30. In this example, applying the second level of error protection can, in some cases, involve avoiding any retransmission of lost data. Thus, according to this example, lost data is only retransmitted if it corresponds to the area of interest in the frame.

The processing of step 154, when performed, can involve waiting for an input signal before taking action and can be continuously repeated until all frames a video stream are transmitted with a delay to await any possible signals indicating lost data from the last frame. In this description, a query is performed to determine if the data lost is related to blocks in the central section in step 158. This query can, however, be omitted in certain implementations. For example, instead of receiving station 30 determining the packet ID identifying the lost packet and comparing it with transmitted data to determine whether it relates to the central section, the signal indicating lost data could include both the packet ID and a bit indicating its status as being in the central section or not. Alternatively, and as discussed in additional detail below, the signal for data loss could be sent to transmitting station 12 only when the first level of protection should be applied. In this way, steps 158 and 162 would be omitted.

Other combinations of steps are possible. According to one example, a block in the central section has a first level of protection applied to the related data in the form of forward error correction (FEC) at the encoder 70 in step 148 while the second level of protection is no protection in step 150 (e.g., FEC is not applied). Then, if data related to other than the central section is lost, the second level of protection is used in step 162. The first level of protection used in step 160 can be no protection in this example. The opposite could also occur. Moreover, additional steps could be added so that both steps 144 and 154 could occur depending on the severity of the loss (e.g., the number of lost packets, the content of a lost packet, etc.).

Figure 9:
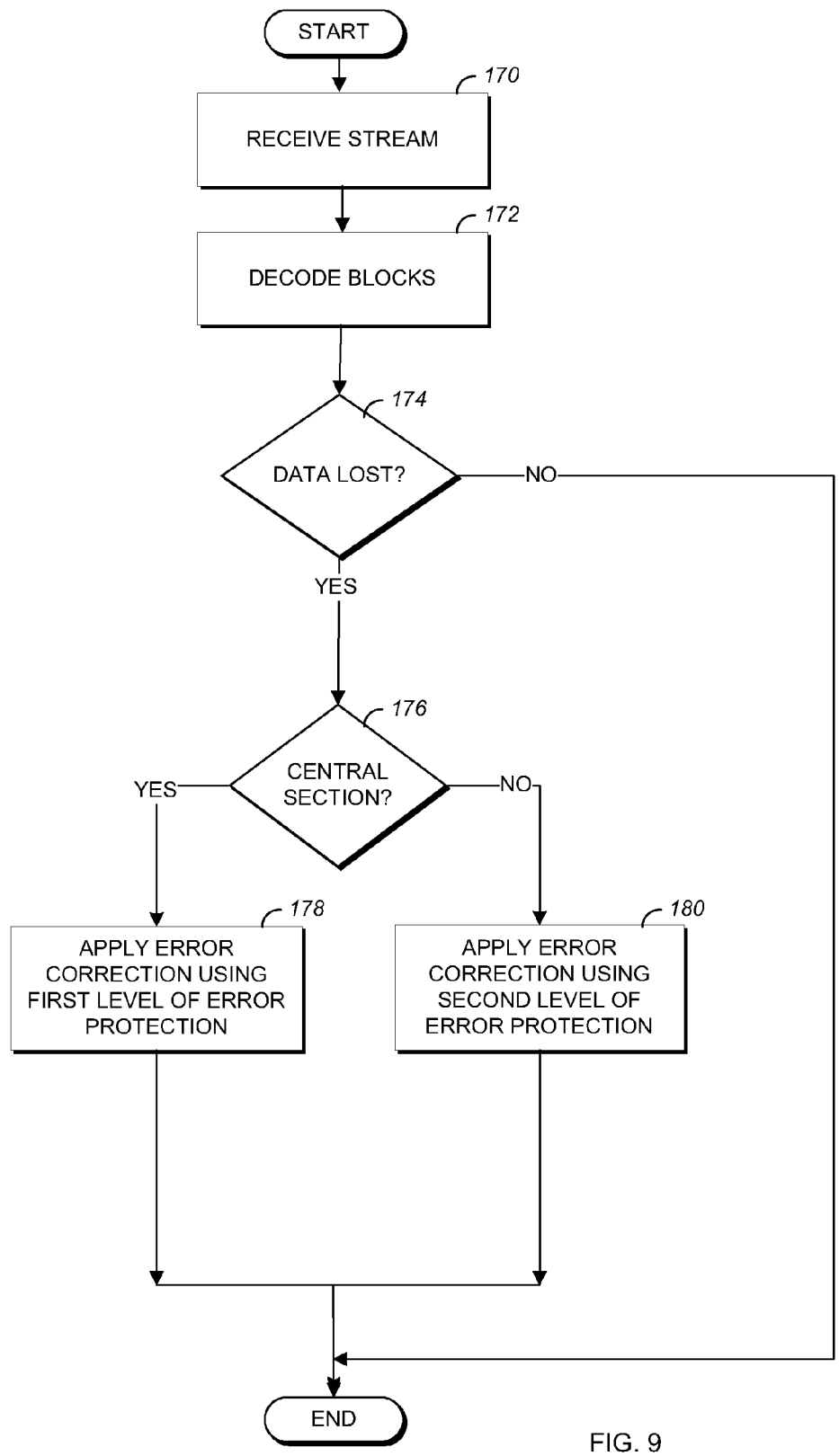
FIG. 9 is a flowchart showing decoding with selective error protection according to an implementation.

FIG. 9 is a flowchart showing decoding with selective error protection according to an implementation. FIG. 9 illustrates the processing of an exemplary frame, and may be repeated as needed for all desired frames in the current video sequence or stream. For purposes of illustration, without any intended limitation, the operations 900 are described in the context of the hardware and software components of FIGS. 1 and 4. In this example, the processing can be performed by CPU 32 and at least portions of decoder 100 coupled to or within CPU 32. In step 170, receiving station 30 receives, or begins to receive, the video stream transmitted by transmitting station 12. Decoder 100 begins to decode the blocks of the received stream in step 172. This operation may be carried out according to the decoding techniques explained in detail above. In this example, the decoding operation is conducted with reference to the specific order in which macroblocks were scanned, namely, the spiral scanning technique described above.

In one example, decoding may further include selectively conducting motion search and/or motion compensation. Further, one or both of these may be limited to blocks within the central section.

Receiving and decoding of the bitstream occurs until an entire frame is received and decoded. During step 174, decoder 100, for example, queries as to whether the received video stream is missing any data from the transmitted video stream. Data may be deemed lost because it is missing or incomplete, because it contains errors preventing proper decoding, or because other flaws are evident. Lost or corrupt data can be identified by comparing received packet IDs, for example, to determine if there are missing packets, or by checking the size or content of a received packet. If there is no lost data, the processing of the current frame ends.

On the other hand, if data has been lost, error correction is applied so as to minimize the effects of the lost data. For ease of illustration, without any intended limitation, steps 176-180 are discussed in the context of loss of a single data packet, where a data packet is a portion of the information needed to recreate one or more blocks. For a given lost data packet, decoder 100 queries as to whether the lost data was associated with a block residing in the area of interest (e.g. the central section) based on, for example, a known frame size, the size (and hence the number) of blocks forming the frame, and the position of the block within the bitstream as compared to other blocks representing the frame. Alternatively or in addition, the information is encoded into the bitstream in headers associated with the appropriate packets. For example, where the three partitions are formed as described below, the lack of an FEC packet associated with packet-3 would indicate that the lost data is not associated with the central section. The nature and extent of one exemplary central section was described above. If the lost data is related to a block residing in the central section, then error correction based on a first level of error protection is applied at step 178. Otherwise, error correction based on a second level of error protection is applied at step 180.

The first and second levels of error protection used in steps 178 and 180 can vary. In one example, decoder 100 applies error correction by re-creating a lost centrally-located block using forward error correction (FEC) packets as applied to some or all blocks in the video stream transmitted by transmitting station 12, while omitting error correction entirely when the block is outside the central section. In a different example, the error correction in step 178 re-creates a block using forward error correction (FEC) packets as generated by a given ratio of blocks in the video stream, while the error correction in step 180 re-creates a block using forward error correction (FEC) packets as generated by a lesser ratio of blocks in the video stream.

In another example, the error correction in step 178 includes transmitting a signal to transmitting station 12 to retransmit the lost data packet, where the packet ID of the data packet is sent. According to a modification of this example, the signal transmitted to can also include a bit or code indicating whether the lost data packet is associated with a block located in the central section. The error correction in step 180 can omit a request for retransmission in an example. In an example, retransmission is only performed in an implementation where transmitting station 12 does not apply any forward error correction. In a different example, retransmission is performed even where transmitting station 12 applies forward error correction depending on the data packet lost.

Processing in FIG. 9 ends when an entire frame is received and decoded.

The processes described above have various advantages, some of which are described as follows. In one example, by limiting the application of forward error correction to certain parts of the bitstream, these techniques avoid the overhead and possible delay of forward error correction applying universally. Although traditional raster scan coding does not offer a practical way to define a region of importance in the frame for protection, this is overcome in an example using spiral scanning, wherein the importance of macroblocks is indicated by the order of scanning.

Although the processing of FIGS. 8 and 9 were explained in the context of two levels of error protection, these techniques may be applied a greater number of error protection levels.

Detailed Example

To supplement the foregoing explanation, a detailed example is given without any intended limitation. Among many useful contexts, this example may be useful in a video conference system or video streaming system.

In this example, a bitstream of an image is divided into three different partitions. A first partition contains picture header, motion vectors, quantization information, and other high level information. The coding of this partition may be performed using any conventional methods, such as a video compression format where the motion vectors can be coded using predictions and variable length code, for example. The motion vector prediction may be performed using spiral scan, a conventional macroblock raster-scan, or another scan pattern. A second partition contains the residual coding of macroblocks from the center section of the frame using spiral scan, e.g., as produced by step 142. A third partition contains the residual coding of macroblocks from the outer part of the image using spiral scan, as produced by step 142.

In this example, an encoder, such as encoder 70, applies a first level of error protection to data associated with a central section of a frame in the form of forward error correction (e.g., at step 148) and applies a second level of error protection to the remainder of the frame by omitting forward error correction (e.g., at step 150).

In this example, the bitstream, such as encoded bitstream 88, is transmitted to receiving station 30 (e.g., in step 152) with partial forward error correction. In the current example, transmitting station 12 protects the first and second partitions with forward error correction, e.g., in step 148, but does not protect the third partition with any forward error correction, e.g., as per step 150.

In the present example, a fifty percent forward error correction is applied to data of the first and second partitions. For example, the original bitstreams of these partitions can be combined together, then divided into two different packets of equal length, referred to as packet-1 and packet-2. An FEC packet may be generated by an XOR operation of packet-1 and packet-2. Ordinarily skilled artisans, having the benefit of this disclosure, will be capable of applying different ratios to the FEC operations. A third packet, packet-3, contains the third partition.

The encoder has total of four packets, namely, packet-1, packet-2, the FEC packet and packet-3. When receiving station 30 receives any two of packet-1, packet-2 and the FEC packet, then the center section of the image can be reconstructed with error protection.

Detailed Example, Scenario 1

To further illustrate this, certain scenarios are set forth. In a first scenario, receiving station 30 correctly receives packet-1 and the FEC packet, while packet-2 and packet-3 are lost. This is equivalent to a fifty percent packet loss. From packet-1 and the FEC packet, receiving station 30 can recover packet-2 according to known techniques, e.g., in step 178 of FIG. 9. Therefore, the central portion of the frame can be reconstructed without errors. The outer part of the frame can be reconstructed by using the motion vectors in the first partition. Since the residual bitstream of the outer part of the frame is lost, there will be reconstruction errors in the outer part of the frame after decoding when applying the second level of error protection, e.g., decoding without using an FEC packet at step 180. However, if the outer part of the image has no large movement and the human eye is less sensitive to the outer part of the image, the resultant image can be acceptable.

Detailed Example, Scenario 2

In a second scenario, receiving station 30 correctly receives packet-2, the FEC packet and packet-3, but loses packet-1. In this case, application of the first level of error protection, e.g., in step 178, results in recovery of the data in packet-1 using packet-2 and the FEC packet. Since packet-3 was not lost, it is decoded in a conventional way by decoder 100. As a result, the entire frame is reconstructed to produce the same image as if no data was lost.

As mentioned above, decoder 100 can signal for retransmission of a lost packet or not based on whether the missing packet refers to blocks in a particular section, e.g., the central section. Retransmission can occur either in place of or in addition to the protection described in these examples. In one example, retransmission could occur if packet-1 and packet-2 were lost by signalling encoder 70 to transmit one of the packets, while the other packet is recovered using the retransmitted packet and the FEC packet. Packet-3 could be conventionally decoded.

The implementations of encoding and decoding described above illustrate some exemplary encoding and decoding techniques. However, encoding and decoding, as those terms are used in the claims, could mean compression, decompression, transformation, or any other processing or change of data.

The words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same implementation unless described as such.

The implementations of transmitting station 12 and/or receiving station 30 and the algorithms, methods, instructions, and such stored thereon and/or executed thereby can be realized in hardware, software, or any combination thereof. The hardware can include, for example, computers, intellectual property (IP) cores, ASICs, programmable logic arrays, optical processors, programmable logic controllers, microcode, microcontrollers, servers, microprocessors, digital signal processors or any other suitable circuit. In the claims, the term "processor" encompasses any of the foregoing hardware, either singly or in combination. The terms "signal" and "data" are used interchangeably. Further, portions of transmitting station 12 and receiving station 30 do not necessarily have to be implemented in the same manner.

Further, in one implementation, for example, transmitting station 12 or receiving station 30 can be implemented using a general purpose computer/processor with a computer program that, when executed, carries out any of the respective methods, algorithms and/or instructions described herein. In addition or alternatively, for example, a special purpose computer/processor can be utilized which can contain specialized hardware for carrying out any of the methods, algorithms, or instructions described herein.

Transmitting station 12 and receiving station 30 can, for example, be implemented on computers in a screencasting system. Alternatively, transmitting station 12 can be implemented on a server and receiving station 30 can be implemented on a device separate from the server, such as a cell phone or other hand-held communications device. In this instance, transmitting station 12 can encode content using an encoder 70 into an encoded video signal and transmit the encoded video signal to the communications device. In turn, the communications device can then decode the encoded video signal using decoder 100. Alternatively, the communications device can decode content stored locally on the communications device, such as content that was not transmitted by transmitting station 12. Other suitable transmitting station 12 and receiving station 30 implementation schemes are available. For example, receiving station 30 can be a generally stationary personal computer rather than a portable communications device and/or a device including encoder 70 may also include decoder 100.

Further, all or a portion of implementations of the present invention can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described implementations have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for encoding a video stream including a plurality of video frames, each frame comprising a plurality of blocks, the method comprising:
    selecting a first block substantially central to a frame and then selecting subsequent blocks in a substantially spiral manner such that each subsequent block adjoins a previously selected block;
    continuing the selecting of subsequent blocks until the selected blocks form a contiguous group of blocks occupying at least a central section of the frame;
    encoding the selected blocks in an order in which the selected blocks were selected using a processor;
    applying a first level of error protection to encoded blocks within the central section; and
    if any encoded blocks are located outside the central section, applying a second level of error protection, different than the first level of error protection, to the encoded blocks outside the central section.

2. The method of claim 1, where the first level of error protection comprises forward error correction and the second level of error protection is no error protection.

3. The method of claim 1, where the first level of error protection comprises forward error correction applied at a first ratio to the encoded blocks within the central section, and the second level of error protection comprises forward error correction applied at a second ratio to the encoded blocks outside the central section, where the first ratio is greater than the second ratio.

4. The method of claim 1, wherein encoding the selected blocks further comprises:
    for encoded blocks within the central section, performing at least one of motion search and motion compensation based on data from blocks only within the central section; and
    for blocks outside the central section, performing at least one of motion search and motion compensation based on data from both blocks within the central section and blocks outside the central section.

5. The method of claim 1 wherein:
    the first level of error protection comprises retransmitting data corresponding to blocks within the central section responsive to the data being lost in transmission to a decoder; and
    the second level of error protection comprises not retransmitting data corresponding to blocks outside the central section responsive to the data being lost in transmission to the decoder.

6. The method of claim 1, further comprising:
    receiving a signal indicating loss of a data packet; and wherein:
    applying the first level of error protection comprises retransmitting the data packet when the data packet includes data related to the encoded blocks within the central section; and
    applying the second level of error protection comprises ignoring the signal when the data packet includes data related to the encoded blocks outside the central section.

7. An apparatus for encoding a video stream having a plurality of video frames, each frame having a plurality of blocks, the apparatus comprising:
    memory; and
    a processor programmed to execute instructions contained in the memory to:
        select a first block substantially central to a frame and then select subsequent blocks in a substantially spiral manner such that each subsequent block adjoins a previously selected block;
        continue the selecting of subsequent blocks until the selected blocks form a contiguous group of blocks occupying at least a central section of the frame;
        encode the selected blocks in an order in which the selected blocks were selected;
        apply a first level of error protection to encoded blocks within the central section; and
        if any encoded blocks are located outside the central section, apply a second level of error protection, different than the first level of error protection, to the encoded blocks outside the central section.

8. The apparatus of claim 7 wherein the first level of error protection comprises forward error correction and the second level of error protection no error protection.

9. The apparatus of claim 7 wherein the processor is programmed to apply the first level of error protection by including forward error correction in an encoded bitstream using a first ratio for data related to the encoded blocks within the central section and to apply the second level of error protection by including forward error correction in the encoded bitstream using a second ratio for data related to the encoded blocks outside the central section; and wherein the first ratio is greater than the second ratio.

10. The apparatus of claim 7 wherein the processor is programmed to encode the blocks by:
    for blocks within the central section, performing at least one of motion search and motion compensation based on data from blocks only within the central section; and
    for blocks outside the central section, performing at least one of motion search and motion compensation based on data from both blocks within the central section and blocks outside the central section.

11. The apparatus of claim 7 wherein the processor, responsive to a signal indicating loss of data, is programmed to:
    apply the first level of error protection by retransmitting the data when the data is related to the encoded blocks within the central section; and apply the second level of error protection by ignoring the signal when the data is related to the encoded blocks outside the central section.

12. A method for decoding a video stream including a plurality of video frames, each frame comprising a plurality of blocks, the method comprising:
   receiving a bitstream of encoded blocks associated with a frame;
   decoding the encoded blocks wherein the encoded blocks are encoded in an order corresponding to a first block substantially central to the frame, a second block adjacent to the first block, and subsequent blocks adjacent to a previously selected block in a spiral manner;
   responsive to data errors affecting decoding of a block of the encoded blocks, using a processor to perform data recovery operations by:
      attempting recovery of data related to the block using a first level of error protection when the block resides within a central section of the frame, the central section of the frame including at least a contiguous set of blocks about a center of the frame; and
      if the block resides outside the central section, performing one of:
         attempting recovery of data related to the block using a second level of error protection, wherein the second level of protection is different than the first level of error protection; or
         skipping recovery of the data related to the block.

13. The method of claim 12 wherein attempting recovery of data related to the block using the first level of error protection comprises:
   using a forward error correction packet to reconstruct the data, the forward error correction packet generated using a first ratio; and wherein attempting recovery of data related to the block using the second level of error protection comprises:
   using a forward error correction packet to reconstruct the data, the forward error correction packet generated using a second ratio, the first ratio being greater than the second ratio.

14. The method of claim 12 wherein the bitstream comprises:
   motion vectors generated by performing at least one of motion search and motion compensation based on data from blocks only within the central section; and
   motion vectors generated by performing at least one of motion search and motion compensation based on data from both within the central section and blocks outside the central section.

15. The method of claim 12 wherein attempting recovery of data related to the block using the first level of error protection comprises:
   transmitting a signal requesting retransmission of the data.

16. The method of claim 15 wherein the signal includes a packet ID for a lost data packet.

17. An apparatus for decoding a video stream having a plurality of video frames, each frame having a plurality of blocks, the apparatus comprising:
   memory; and
   at least one processor programmed to execute instructions contained in the memory to:
      receive a bitstream of encoded blocks associated with a frame;
      decode the encoded blocks wherein the encoded blocks are encoded in an order corresponding to a first block substantially central to the frame, a second block adjacent to the first block, and subsequent blocks adjacent to a previously selected block in a spiral manner;
      responsive to data errors affecting decoding of a block of the encoded blocks, perform data recovery by:
         attempting recovery of data related to the block using a first level of error protection when the block resides within a central section of the frame, the central section of the frame including at least a contiguous set of blocks about a center of the frame; and
         if the block resides outside the central section, perform one of:
            attempting recovery of data related to the block using a second level of error protection, wherein the second level of protection is different than the first level of error protection; or
            skipping recovery of the data related to the block.

18. The apparatus of claim 17 where the processor is programmed to attempt recovery of data related to the block using the first level of error protection by:
   using a forward error correction packet to reconstruct the data, the forward error correction packet generated using a first ratio; and to attempt recovery of data related to the block using the second level of error protection by:
   using a forward error correction packet to reconstruct the data, the forward error correction packet generated using a second ratio, the first ratio being greater than the second ratio.

19. The apparatus of claim 17 wherein the processor is programmed to attempt recovery of data related to the block using the first level of error protection by requesting retransmission of the data.

20. The apparatus of claim 17 wherein the processor is configured to determine whether the block resides within the central section of the frame or outside the central section based on a position of the block within the bitstream relative to other blocks of the frame.

* * * * *